United States Patent [19]

Farr

[11] Patent Number: 4,636,720
[45] Date of Patent: Jan. 13, 1987

[54] PHASE DETECTOR

[75] Inventor: Aaron V. Farr, Logan, Utah

[73] Assignee: Abex Corporation, Boston, Mass.

[21] Appl. No.: 676,690

[22] Filed: Nov. 30, 1984

[51] Int. Cl.$^4$ ............................................. G01R 25/00
[52] U.S. Cl. ..................................... 324/86; 324/83 R
[58] Field of Search ...................... 324/86, 83 A, 83 R,
324/83 D, 107; 307/127; 328/137; 340/658;
361/76, 77, 85; 318/621

[56] References Cited

U.S. PATENT DOCUMENTS

| | | | |
|---|---|---|---|
| 2,434,961 | 1/1948 | Ridley | 324/86 |
| 2,503,598 | 4/1950 | Simkins | 324/86 |
| 3,134,076 | 5/1964 | Haner | 324/86 |
| 3,156,868 | 11/1964 | Murrills | 324/86 |
| 4,199,798 | 4/1980 | Leppke | 324/86 |
| 4,210,948 | 7/1980 | Waltz | 324/86 |
| 4,366,521 | 12/1982 | Jessee | 324/86 |

Primary Examiner—Michael J. Tokar
Attorney, Agent, or Firm—Thomas S. Baker, Jr.

[57] ABSTRACT

A phase detector for monitoring the presence, sequence and polarity of each phase line for a three-phase power input and indicating when a phase is missing or out of sequence.

6 Claims, 2 Drawing Figures

PHASE DETECTOR

BACKGROUND OF THE INVENTION

This invention relates to a phase detector which monitors the presence, sequence and polarity of each phase of a three-phase line power input and provides an immediate indication when one or more of the phases is missing, out of sequence or of incorrect polarity.

Three-phase, alternating current, line powr inuts are commonly used to operate electric motors. The frequencies and voltages of three-phase inputs vary widely. Control of a motor driven by a three-phase line input can be lost if one or more phase line inputs is lost due to a malfunction, for example such as an overload condition, which causes safety devices in one or more phase lines to disconnect these lines. Control of a motor also can be lost if the three-phase lines are connected improperly and the phase lines are not of sequence or of incorrect polarity. Polarity of a three-phase line input is important because in some motors power is supplied to the motor during the positive portion of the line phases to cause the motor to rotate in one direction and during the negative portion of the line phases to cause the motor to rotate in the opposite direction.

Because a missing phase, an out of sequence phase or a phase of the wrong polarity can disrupt the operation of a device such as an electric motor, which is driven by the three-phase line power input, it is desirable to have a device which can be connected to a three-phase line power input and monitor the presence, the sequence and polarity of the phases in each line. In the event a phase is lost, out of sequence, or of the wrong polarity, the device should provide an immediate indication of such condition.

Presently existing phase detectors, which monitor three-phase line power inputs, can function only over a very narrow range of line power input voltages. Any change in input voltage requires numerous adjustments of the detector. Three-phase line power inputs commonly range from 120 volts to approximately 600 volts. However, a phase detector which is used to monitor the three-phase line power input of 120 volts cannot be used to monitor a power input of 600 volts. The voltage range from 120 to 600 volts is too great. Consequently, different phase detector units must be used for three-phase line power inputs of substantially different voltages.

Existing phase detectors also are frequency sensitive. Consequently, a phase detector which is used with a three-phase line power input having a frequency of 60 Hz cannot be used to monitor a power input with a frequency of 50 Hz. Additionally, currently available phase detectors require the presence of at least two phase line inputs to operate. Therefore, they cannot provide an indication which differentiates between when a three-phase power input is completely dead and there is no power in any phase and when it is not completely dead and there is power in one phase line. The ability of a phase detector to distinguish between these two conditions would be extremely helpful to people who have to services devices connected to the three-phase lines.

SUMMARY OF THE INVENTION

The phase detector of the instant invention can monitor a three-phase line power input which has an effective input voltage ranging from 15 volts to 600 volts and a frequency ranging from 10 Hz to 1,000 Hz without adjustment. This device immediately will indicate if one or more phases is lost, out of sequence or of incorrect polarity. Additionally, the device will function if there is power in only one phase line of a three-phase line power input.

It is a further object of the instant invention to provide a phase detector for monitoring a first phase line, a second phase line and a third phase line for a three-phase line power input in which each phase has a positive polarity region and a negative polarity region occurring in a given sequence. First, second and third cross-over detecting means are provided having respective first, second and third activator signals in the presence of the transition of the first, second and third respective phases between said regions. First, second and third activators are provided alternatively having a first line condition input corresponding with the presence of the next adjacent phase of said given sequence thereof or a second line phase condition input corresponding with the absence of the next adjacent phase of said given sequence thereof and actuable in response to said first, second and third activator signals to provide first, second and third respective outputs corresponding to the line phase conditions at the first, second and third respective inputs thereof. Further provided is a first actuator means which is activated when all of said first, second and third respective outputs have said first line phase condition.

Other objects of the invention will, in part, be obvious and will, in part, appear hereinafter.

The invention, accordingly, comprises the circuit possessing the construction, combination of elements and arrangement of parts which are exemplified in the following detailed disclosure.

For a fuller understanding of the nature and objects of the invention, reference should be had to the following detailed description taken in connection with the accompanying drawings.

DETAILED DESCRIPTION

Figure 1:
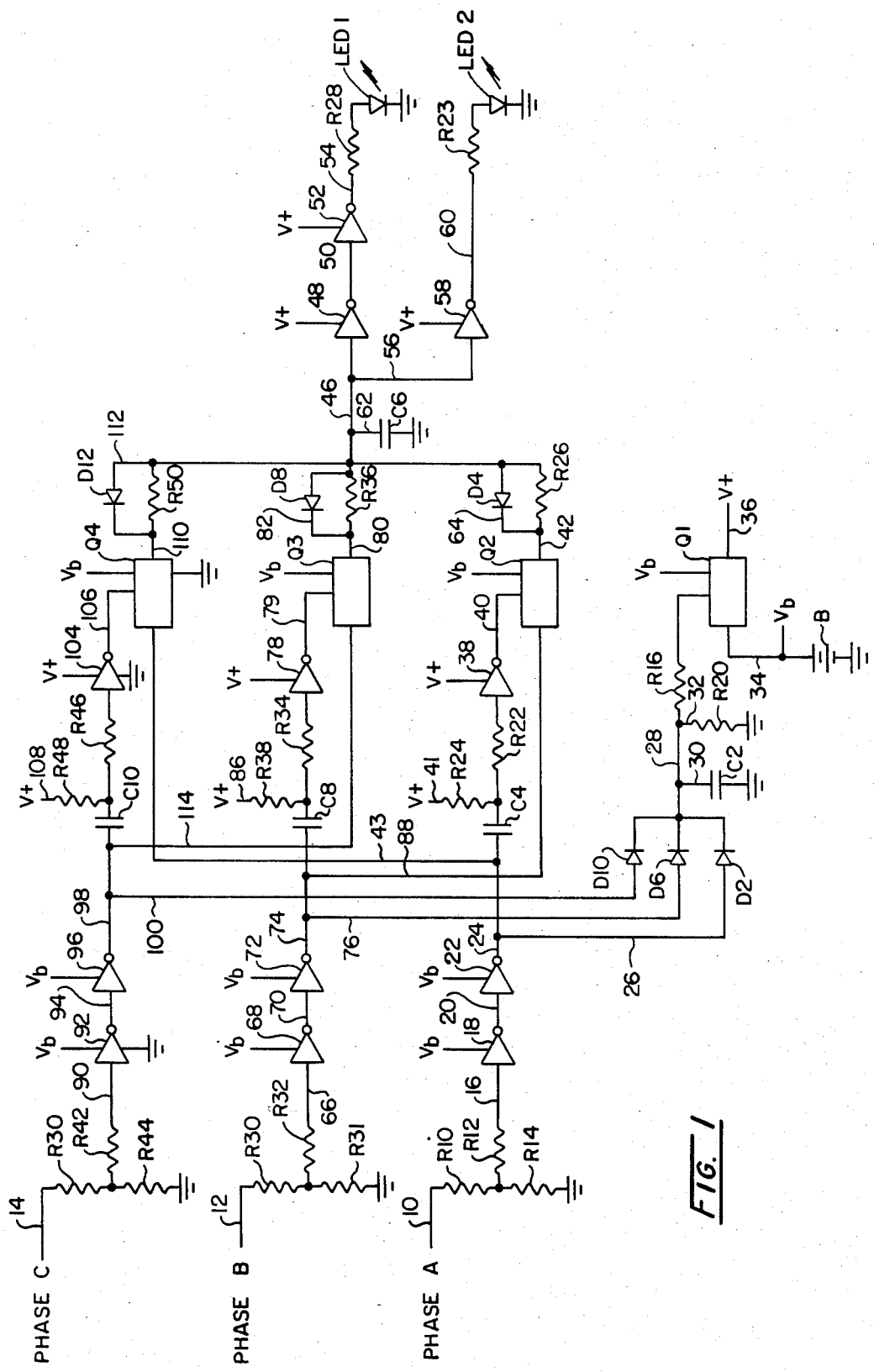
FIG. 1 is a schematic circuit diagram of the phase detector of the instant invention.

Referring to FIG. 1, the phase detector circuit of the instant invention is connected to three phase lines identified as A, B and C of a three-phase line power input (FIG. 2) through lines 10, 12 and 14, respectively in order to monitor the presence, sequence and polarity of each line phase. The power phase in each phase line A, B and C will be designated phase A, B and C, respectively. The phase A input line is connected to the input of a Schmitt inverter 18 through resistor R10, line 10, resistor R12 and line 16. A resistor R14 in line 10 and connected between resistor R10 and ground cooperates with resistor R10 to form a voltage divider network. This network cooperates with resistor R12 to reduce the voltage input to inverter 18. The output of inverter 18 at line 10 is connected to the input of a Schmitt inverter 22 which has an output at line 24. This output is connected through line 26 which contains diode D2, line 28 and resistor R16 to the gate of a field effect transistor Q1. Line 30 which is connected to line 28 between diode D2 and resistor R16 is connected to one side of a capacitor C2, the other side of which is connected to ground. Line 32 which contains a stabilizing resistor R20 also is connected between line 28 and ground.

One side of a voltage source, B, which has a magnitude $v_b$ of approximately 9 volts and is preferably a battery, is connected through line 34 to the input of transistor Q1 and the other side is connected to ground. Transistor Q1 is a metal on silicon N channel and P channel enhancement mode device in a single monolithic structure. With this device, a positive voltage at the gate causes the drain and source to be connected with the transistor Q1 producing a small resistance therebetween. Either the drain or source of transistor Q1 may be designated the input or the output of the device. Thus, if there is a positive voltage at the gate of transistor Q1 and a voltage $v_b$ at the input thereof, a voltage v is at the output of the device at line 36. If there is no voltage at the gate of transistor Q1, there is no connection between the input and output of the device and no voltage is supplied to line 36.

It should be noted that battery B provides power $v_b$ to Schmitt inverters 18 and 22 at all times and that these devices have internal diodes which limit the maximum voltage at their inputs or outputs to battery voltage $v_b$ even if the voltage at line 16 from phase line A is greater than the voltage of battery b. Other internal diodes limit the minimum voltage at the inputs or outputs of the devices to the voltage of ground. Consequently, inverters 18 and 22 are responsive only to voltage inputs which have positive polarity.

The output of Schmitt inverter 22 at line 24 further is connected to the input of a field effect transistor Q4 thrugh line 43. This output also is connected to one side of a capacitor C4 the other side of which is connected through resistor R22 to the input of Schmitt inverter 38. The output of inverter 38 at line 40 is connected to the gate of a field effect transistor Q2.

One end of line 41 which contains resistor R24 is connected to line 24 between capacitor C4 and resistor R22 and the other end is connected to line 36 at the output of transistor Q1. Transistor Q2 is identical to transistor Q1 and a positive voltage at the gate thereof connects the input and output of the device. The output of transistor Q2 at line 42 is connected through resistor R26 and line 46 to the input of Schmitt inverter 48 which has an output at line 50 connected to the input of a Schmitt inverter 52. Inverter 52 has an output at line 54 which is connected through resistor R28 to the anode of a green light emitting diode LED1 of which the cathode is connected to ground. The output of transistor Q2 at line 42 also is connected through resistor R26 and lines 46 and 56 to the input of a Schmitt inverter 58. This inverter has an output at line 60 which is connected through resistor R28 to the anode of a red light emitting diode LED2 of which the cathode is connected to ground. Light emitting diodes LED1 and LED2 provide a visual indication of whether the phases of phase lines A, B, and C are present in the correct sequence and of a specified polarity. One side of capacitor C6 is connected through line 62 to line 46 and the other side is connected to ground. Line 64 which contains diode D4 is connected to line 42 in parallel with resistor R26. From the above, it can be seen that phase line A of the line power input at line 10 is connected to the gates of transistors Q1 and Q2 and to the input of transistor Q4.

The phase B input line is connected through resistor R30, line 12, resistor R32 and line 66 to the input of Schmitt inverter 68 which has an output at line 70. Line 70 is connected to the input of Schmitt inverter 72. A resistor R31 in line 12 and connected between resistor R30 and ground cooperates with resistor R30 to form a voltage divider network. This network cooperates with resistor R32 to reduce the voltage input to inverter 68. Inverters 68 and 72 are identical to inverters 18 and 22. They receive power $v_b$ continuously from source B and have internal diodes which limit the maximum voltage at their inputs and outputs to battery voltage $v_b$ and which limit the minimum voltage at their inputs and outputs to ground. Inverter 72 has an output at line 74 which is connected through line 76 which contains diode D6, line 28 and resistor R16 to the gate of transistor Q1. This output further is connected to the input of transistor Q2 through line 88 and to one side of a capacitor C8, the other side of which is connected thorugh resistor R34 to the input of Schmitt inverter 78. Inverter 78 has an output at line 79 which is connected to the gate of a field effect transistor Q3. Transistor Q3 is identical to transistors Q1 and Q2. The output of transistor Q3 at line 80 is connected through resistor R36 and line 46 to light emitting diodes LED1 and LED2 through the arrangement of inverters and resistors which connect the output of transistor Q1 to diodes LED1 and LED2 described above. Line 82 which contains diode D8 is connected to line 80 in parallel with resistor R36. One end of line 86 which contains resistor R38 is connected to line 74 between capacitor C8 and resistor R34. The other end of line 86 is connected to the output of transistor Q1 at line 36. Thus, it can be seen that phase line B of the line power input at line 12 is connected to the gates of transistors Q1 and Q3 and to the input of transistor Q2.

The phase C input is connected through resistor R40, line 14, resistor R42 and line 90 to the input of Schmitt inverter 92 which has an output at line 94 connected to the input of Schmitt inverter 96. A resistor R44 in line 14 between resistor R40 and ground cooperates with resistor R40 to form a voltage divider network for the incoming line voltage. This network cooperates with resistor R42 to reduce the voltage input to inverter 92. Inverters 92 and 96 are identical to inverters 18 and 22. They receive power at all times from source B, have internal diodes which limit the maximum voltage at their inputs and outputs to a maximum of battery voltage $v_b$ and which limit the minimum voltage at thei inputs and outputs to ground. Schmitt inverter 96 has an output at line 98 which is connected through line 100 which contains diode D10, line 28 and resistor R16 to the gate of transistor Q1. The inverter output at line 98 further is connected to the input of transistor Q3 through line 114 and to one side of capacitor C10. The other side of capacitor C10 is connected through resistor R46 to the input of Schmitt inverter 104. Inverter 104 has an output at line 106 which is connected to the gate of field effect transistor Q4. This transistor is identical to transistors Q1, Q2 and Q3. One end of line 108 which contains resistor R48 is connected to line 98 between capacitor C10 and resistor R46. The other end of line 108 is connected to the output of transistor Q1 at line 36. The output of transistor Q4 at line 110 is connected through resistor R50, and lines 46 and 56 to light emitting diodes LED1 and LED2 through the arrangement of inverters and resistors which connect the output of transistor Q1 to the light emitting diodes LED1 and LED2 described above. Line 112 which contains diode D12 is connected to line 110 in parallel with resistor R50. Accordingly, it can be seen that phase line C of the line power input at line 14 is connected to the gates of transistors Q1 and Q4 and to the input of transistor Q2.

It should be noted that inverters 38, 78, 104, 48, 52 and 58 are connected to the output of transistor Q1 at line 36 and are activated when voltage v+ is present in that line. Line 41 which is connected to the input of inverter 38 through resistor R24, line 24, and resistor R22 also is connected to line 36 as mentioned above. Similarly, line 86 which is connected to the input of inverter 78 through resistor R38, line 74 and resistor R34 and line 108 which is connected to the input of inverter 104 through resistor R48, line 98 and R46 are also connected to line 36. Consequently, when transistor Q1 is activated and voltage v is applied to line 36, the inputs to inverters 38, 78 and 104 normally receive a logic high signal and the outputs, which are connected to the gates of respective transistors Q2, Q3 and Q4, are at a logic low condition which causes the devices Q2, Q3 and Q4 to be inactive.

Schmitt inverters 18, 22, 68, 72, 92 and 96 receive power $v_b$ continuously from source B as described above. This source also provides power $v_b$ to transistors Q1, Q2, Q3 and Q4 at all times. The state of the light emitting diodes LED1 and LED2 which indicate the condition of the three line phases will initially be described when none of the three line phases is providing power. When there is no line power input from phase A at line 10, there is a logic low value at the input line 16 of Schmitt inverter 18. Inverter 18 converts this input to a logic high value output at line 20 which is input to inverter 22. This inverter inverts the input and provides a logic low value at its output at line 24. This logic low value is seen at the anode and cathode of diode D2 and at the gate of transistor Q1. As a result, transistor Q1 is not activated and an open circuit remains between the input at line 34 and the output at line 36. There is no v+ voltage applied to line 36 and, therefore, inverters 48, 52, and 58 which are connected to and power light emitting diodes LED1 and LED2 are not activated. Consequently, the light emitting diodes LED1 and LED2 are not lighted. Similarly, if there is no power from phase B of the line input at line 12, the output of Schmitt inverter 72 at line 74 is a logic low value which is seen at the anode and cathode of diode D6 and at the gate of transistor Q1. Since transistor Q1 is not activated, the light emitting diodes LED1 and LED2 are not energized as described above in connection with the phase A input. Likewise, if there is no phase C component of line power input at line 14, the output of Schmitt inverter 96 at line 98 is a logic low value which is seen at the anode and cathode of diode D10 and at the gate of transistor Q1. Since transistor Q1 is not activated, light emitting diodes LED1 and LED2 are not lighted as described above in connection with the phase A line input. Thus, if all three phases of the line power input are missing, neither of the light emitting diodes LED1 and LED2 will be lighted.

The condition of the light emitting diodes LED1 and LED2 will next be described when one of the three line phases of power is present. Assuming there is an input at line 10 from phase A of the line power input, if phase A is in the positive polarity region, a logic high value is applied to the input of Schmitt inverter 18. Inverter 18 inverts the input and outputs a logic low value at line 20. This logic low value is inverted by inverter 20 to a logic high value output at line 24. This logic high value is seen at the gate of transistor Q1 which activates device and connects the input at line 34 to the output at line 36 as described previously. When this occurs, line 36 is at the v+ voltage which activates Schmitt inverters 38, 78 and 104 in the circuits of phase lines A, B and C, respectively. This voltage also is connected to the input of inverter 38 through lines 41 and 24 to effect a logic high value there, to the input of inverter 78 through lines 86 and 74 to effect a logic high value there, and to the input of inverter 104 through lines 108 and 98 to effect a logic value there. Inverters 38, 78 and 104 convert the logic high values at their inputs to logic low values at their outputs. Since the outputs of the inverters 38, 78 and 104 are connected to the gates of transistors Q2, Q3 and Q4, respectively, these devices are not activated and their respective output lines 42, 80 and 110 are open circuited.

The v+ voltage also activates Schmitt inverters 48 and 52 which are serially connected to the input of green light emitting diode LED1 and Schmitt inverter 58 which is connected to the input of red light emitting diode LED2. Since there are two inverters connected to the anode of light emitting diode LED1 and one inverter connected to the anode of light emitting diode LED2, the light emitting diodes LED1 and LED2 will be in opposite states when the inverters are activated, i.e. if one is energized by a logic high value at the anode thereof, the other must be de-energized by a logic low value at the anode thereof. When the phase detector is initially connected to the three line phases A, B and C, capacitor C6 which is connected to line 46 is discharged. This causes line 46 which is connected to the input of Schmitt inverter 48 and is connected through line 56 to the input of Schmitt inverter 58 to be at a logic low value. Inverter 48 inverts the input to a logic high value at line 50 which is input to inverter 52. Inverter 52 inverts the input to a logic low value at its output at line 54 and green light emitting diode LED1 is not energized. Inverter 58 inverts the logic low value at its input to a logic high value at its output at line 60 to thereby energize red light emitting diode LED2. This indicates the system has received power from at least one line phase but all three phases are not present, in the proper sequence and of the proper polarity. In order for green light emitting diode LEd1 to be lighted, capacitor C6 must be charged so that line 46 is at a logic high value. This only occurs if the outputs of transistors Q2, Q3 and Q4 at lines 42, 80 and 110, respectively, all are at a logic high value or are open circuited which occurs only if each of the phases is present, in the proper sequence and of the correct polarity.

If phase B is present in the positive polarity region, the input of inverter 68 at line 66 will have a logic high value and the output of inverter 72 at line 74 will be a logic high value. This logic high value will activate transistor Q1 and energize red LED2 in the same manner as when transistor Q1 is energized by phase A as just described. Likewise, if phase C is present and in the positive polarity region, the input of inverter 92 at line 90 will have a logic high value and the output of inverter 96 at line 98 will be a logic high value. This logic high value will activate transistor Q1 and energize red LED2 in the same manner as when transistor Q1 is energized by phase A as described above.

Figure 2:
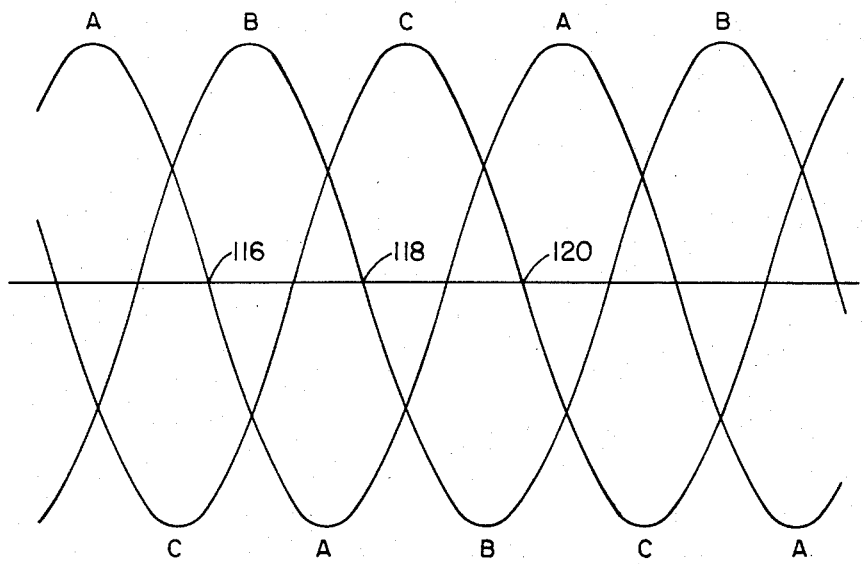
FIG. 2 is a diagram of three phase lines of a three-phase voltage input which are monitored by the phase detector of the instant invention.

Referring to FIG. 2, which illustrates in diagrammatic fashion the relationship of the three line phases designated A, B and C of a three-phase line power input, if all phases are present and in the proper sequence, phase B will be positive when phase A makes the transition from the positive polarity region to the negative polarity region indicated at point 116, phase C will be positive when phase B makes the transition from the positive polarity region to the negative polarity region indicated at point 118 and phase A will be positive when phase C makes the transition from the positive polarity region to the negative polarity region indicated at point 120. In order to ascertain if each of the three line phases A, B, and C is present, in the proper sequence and of the correct polarity, the phase detector circuit checks for the presence of the subsequent phase, which is indicated only if the phase is present and in the positive polarity region, each time a phase makes a transition from the positive polarity region to the negative polarity region. It does this sequentially for each of the three phase lines A, B and C.

Referring again to FIG. 1, assuming there is a phase A input in the positive polarity region at line 10, there is a logic high value at the input of inverter 18 and at the output of Schmitt inverter 22 at line 24 as previously mentioned. This logic high value at line 24 activates transistor Q1, is applied to the input of transistor Q4 and is at the side of capacitor C4 connected to the output of inverter 22. The input of inverter 38 and the side of capacitor C4 connected to resistor R22 also are at a logic high value from the v+ voltage in line 41 and the output of inverter 38 at line 40 which is connected to the gate of transistor Q2 is at a logic low value as previously mentioned. However, when the phase A line input makes a transition from the positive polarity region to the negative polarity region, the input of inverter 18 will be a logic low value as will the output of inverter 22 at line 24. Consequently, the side of capacitor C4 connected to line 24 will assume a logic low value. This will cause the side of capacitor C4 connected to resistor R22 to immediately drop to 0 volts and this signal will be coupled across resistor R22 to the input of Schmitt inverter 38. The logic low value input will be inverted to a logic high value at the output at line 42 which is connected to the gate of transistor Q2. As a result, transistor Q2 will be activated and the input of transistor Q2 at line 88 will be coupled to the output at line 42. If the phase B line input is present and positive at line 12, the input of inverter 68 will be a logic high value and the output of inverter 72 will be a logic high value. This logic high value will be present at line 88 at the input of transistor Q2 and will be output at line 42 to line 46 to begin to charge capacitor C6. It should be observed that the logic high value input at line 88 will be connected to the output at line 42 for a short period of time (on the order of 200 milliseconds) because the voltage at line 41 will immediately begin to charge capacitor C4 after it is discharged and cause a logic high value at the input of Schmitt inverter 38. This inverter having a hysteresis operational characteristic the output will immediately assume a logic low value when the input reaches a signal value of about two-thirds of the threshold characteristic thereof. When the output of inverter 38 is at a logic low value and transistor Q2 is not activated, the device assumes an open circuit state. Additionally, a logic low value will be present in line 46 connected to the input of inverter 48 and in line 56 connected to the input of inverter 58 to cause red light emitting diode LED2 to be lighted until capacitor C6 is charged such that lines 46 and 56 reach a signal value of about two-thirds the threshold characteristic of Schmitt inverters 48 and 58. (If all three phases are present and in the proper sequence, the time from when the phase detector circuit begins checking the three line phases until the signal value reaches two-thirds the threshold characteristic is about 100 milliseconds.) When this signal value is reached at the inputs of inverters 48 and 58, inverters 48 and 58, which have a hysteresis operational characteristic, will immediately assume a logic low value at their outputs at lines 50 and 60, respectively. The logic low value at line 60 will de-energize red light emitting diode LED2. A logic low value at line 50 at the input of Schmitt inverter 52 will be inverted to a logic high value at the output at line 54 which will energize green light emitting diode LED1.

Similarly, if there is a phase B input in the positive polarity region at line 12, there is a logic high value at the input of inverter 68 and at the output of Schmitt inverter 72 at line 74. This logic high value at line 74 activates transistor Q1, is applied to the input of transistor Q2 and is at the side of capacitor C8 connected to the output of inverter 72. The input of inverter 78 and the side of capacitor C8 connected to resistor R34 are also at a logic high value and the output of inverter 78 at line 79 which is connected to the gate of transistor Q3 is at a logic low value as previously mentioned. However, when the phase B line input makes a transition from the positive polarity region to the negative polarity region, the input of inverter 68 will be a logic low value as will the output of inverter 72 at line 74. Thus, the side of capacitor C8 connected to line 74 will assume a logic low value. This will cause the side of capacitor C8 connected to resistor R34 to drop to 0 volts and this signal will be coupled across resistor R34 to the input of Schmitt inverter 78. The logic low value input to inverter 78 will be inverted to a logic high value at the output at line 79 which is connected to the gate of transistor Q3. As a result, the input of transistor Q3 at line 114 will be coupled to the output at line 80. If the phase C line input is present and positive at line 14, the input of inverter 92 will be a logic high value and the output of inverter 96 at line 98 will be a logic high value. This logic high value will be present at line 114 at the input of transistor Q3 and will be output at line 80 to line 46 to further charge capacitor C6.

Likewise, if there is a phase C input in the positive polarity region at line 14, there is a logic high value at the input of inverter 92 and at the output of inverter 96 at line 98. This logic high value at line 98 activates transistor Q1, is applied to the input of transistor Q3 and is at the side of capacitor C10 connected to the output of inverter 96. The input of inverter 104 and the side of capacitor C10 connected to resistor R46 also are at a logic high value from the v+ voltage in line 108 and the output of inverter 104 at line 106 which is connected to the gate of transistor Q4 is at a logic low value as previously mentioned. However, when the phase C line input makes a transition from the positive polarity region to the negative polarity region, the input of inverter 92 will be a logic low value as will the output of inverter 96 at line 98. Consequently, the side of capacitor C10 connected to line 98 will assume a logic low value. This will cause the side of capacitor C10 connected to resistor R46 to immediately drop to 0 volts and this signal will be coupled across resistor R46 to the input of Schmitt inverter 104. The logic low value input to inverter 104 will be inverted to logic high value at the output at line 106 which is connected to the gate of transistor Q4. As a result, the input of transistor Q4 at line 43 will be coupled to the output at line 110. If the phase A line input is present and positive at line 10, the input of inverter 18 will be a logic high value and the output of inverter 22 will be a logic high value. This logic high value will be present at line 43 at the input of transistor Q4 and will be output at line 110 to line 46 to further charge capacitor C6. It should be noted that capacitor C6 stores electrical energy so that light emitting diode LED1 will have a steady-state output as it sequentially receives the outputs of transistors Q2, Q3 and Q4.

As mentioned above, when a logic low value is applied to the gates of transistors Q2, Q3 and Q4 the devices assume an open circuit state. So long as a logic high value signal is present at the input of each of the transistors Q2, Q3 and Q4 when they are activated by the positive to negative cross-over of the A, B and C phase lines, respectively, capacitor C6 will reach a signal value of about two-thirds of the threshold characteristic of Schmitt inverters 48 and 58, red light emitting diode LED2 will be turned off and green light emitting diode LED1 will be lighted. As previously mentioned, this indicates that all three line phases A, B and C are present, in the proper sequence, and of the correct polarity.

Operation of the phase detector circuit when a phase line is lost, out of sequence or of the wrong polarity which causes green light emitting diode LED1 to be de-energized and red light emitting diode LED2 to be energized will next be described. If, for example, phase B is not present at line 12 or not in the positive polarity region when phase A makes the transition from the positive polarity region to the negative polarity region at which time a logic high value is applied to the gate of transistor Q2, there will not be a logic high value input to transistor Q2 through line 88. Consequently, when transistor Q2 is activated, there will be a logic low value at its input and capacitor C6 will immedaitely discharge through line 62, line 46, line 42, line 64, diode D4, line 42 and transistor Q2. When capacitor C6 is discharged, lines 46 and 56 which are connected to the inputs of Schmitt inverters 48 and 58, respectively, will assume a logic low value. Inverter 58 will invert the logic low value at line 56 and output a logic high value at line 60 which will energize red light emitting diode LED2. Inverter 48 will invert a logic low value input at line 46 and output a logic high value at line 50 to the input of inverter 52. Inverter 52 will invert the logic high value and output a logic low value at line 54 to de-energize green light emitting diode LED1. Similarly, if phase C is missing when transistor Q3 is activated by the cross-over of phase B from the positive to the negative polarity region, capacitor 6 will discharge through line 62, line 46, line 110, line 82, diode D8, line 80 and transistor Q3. Likewise, if phase A is missing when transistor Q4 is activated by the cross-over of phase C from the positive to the negative polarity region capacitor C6 will discharge through line 62, line 46, line 110, line 112, diode D12, line 110, and transistor Q4. When all three phase lines are again present, in the proper sequence and of the correct polarity, capacitor C6 will again charge and subsequently green light emitting diode LED1 will be lighted.

From the above it can be seen that the phase detector of the instant invention will provide an indication if all three phase lines of a three phase line input are present, in the proper sequence and of correct polarity and will also indicate if one or more phases is lost, out of sequence or of incorrect polarity. Additionally, the device will function if it receives power from only one phase line of a three-phase line power input.

Since certain changes may be made in the above-described circuit, without departing from the scope of the invention herein, it is intended that all matter contained in the description thereof or shown in the accompanying drawings shall be interpreted as illustrative and not in a limiting sense.

I claim:

1. A phase detector for monitoring a first phase line, a second phase line and a third phase line for a three-phase line power input in which each phase has a positive polarity region and a negative polarity region occurring in a given sequence which comprises:
   first, second and third cross-over detecting means for deriving respective first, second and third activator signals in the presence of the transition of the first, second and third respective phases between said regions;
   first, second and third activators having activator inputs connected to said first, second and third cross-over detecting means respectively, having line phase inputs connected to the next adjacent phase lines of said given sequence, and having activator ouputs;
   said first, second and third activators alternatively having a first line phase condition at their line phase inputs corresponding with the presence of the next adjacent phase of said given sequence thereof or a second line phase condition at their inputs corresponding with the absence of the next adjacent phase of said given sequence thereof;
   said first, second and third activators being actuable in response to said first, second and third activator signals to provide first, second and third activator output signals at their respective outputs corresponding to the line phase condition at the first, second and third respective line phase inputs thereof; and
   first perceptible indicating means connected to said first, second and third activator outputs which is activated when all of said first, second and third respective activator outputs have said first line phase condition.

2. The phase detector of claim 1 in which:
said detector includes second perceptible indicating means which is activated when one of said first, second and third respective outputs has said second line phase condition.

3. The phase detector of claim 1 in which:
said detector includes a fourth activator means responsive in the presence of a select line phase condition at any of the first, second or third phase lines for providing an enable output to said first perceptible indicating means.

4. The phase detector of claim 2 in which:
said detector includes a fourth activator responsive to the presence of a select line phase condition at any of the first, second or third phase lines for providing an enable output to said second perceptible indicating means.

5. The phase detector of claim 1 in which:
said detector includes an energy storage device which causes said first perceptible indicating means to have a steady state output.

6. The phase detector of claim 3 in which:
said fourth activator means is responsive in the presence of a select line phase condition at any of the first, second or third phase lines to provide an enable output to said first, second and third cross-over detecting means.

* * * * *